(12) United States Patent
Hayama et al.

(10) Patent No.: US 6,828,670 B2
(45) Date of Patent: Dec. 7, 2004

(54) MODULE COMPONENT

(75) Inventors: Masaaki Hayama, Nara (JP); Hiroshi Higashitani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 29 days.

(21) Appl. No.: 10/433,843

(22) PCT Filed: Oct. 11, 2002

(86) PCT No.: PCT/JP02/10591

§ 371 (c)(1), (2), (4) Date: Jun. 9, 2003

(87) PCT Pub. No.: WO03/034494

PCT Pub. Date: Apr. 24, 2003

(65) Prior Publication Data
US 2004/0021218 A1 Feb. 5, 2004

(30) Foreign Application Priority Data

Oct. 15, 2001 (JP) ....................................... 2001-316407

(51) Int. Cl.[7] ........................................... H01L 23/053
(52) U.S. Cl. ..................... 257/700; 257/723; 257/750; 257/758; 257/778; 438/107; 438/108; 438/109; 438/622; 438/652
(58) Field of Search ................................ 257/686, 700, 257/723, 724, 750, 758, 778; 438/107–109, 622, 652

(56) References Cited

U.S. PATENT DOCUMENTS 6,588,097 B2 * 7/2003 Nishide et al. ................ 29/832

FOREIGN PATENT DOCUMENTS

| JP | 60-138951 | 7/1985 |
| JP | 60-171754 | 9/1985 |
| JP | 3-266493 | 11/1991 |
| JP | 5-226506 | 9/1993 |
| JP | 6-21264 | 1/1994 |
| JP | 7-66361 | 3/1995 |
| JP | 2000-306730 | 11/2000 |

* cited by examiner

Primary Examiner—Hsien-Ming Lee
(74) Attorney, Agent, or Firm—RatnerPrestia

(57) ABSTRACT

A module component includes a wiring circuit pattern formed on an insulated resin layer, and a connecting conductor, which is formed within the insulated resin layers, for electrically connecting at least two of the wiring circuit patterns each other. The module component further includes an active component and a passive component, which are formed on at least one of the wiring circuit patterns and electrically connected thereto, and a coil formed within a laminated member. The coil is formed of a coil pattern made of a conductive material, and formed on the insulated resin layer. Magnetic materials, which are formed on the insulated resin layers, sandwich the coil pattern.

7 Claims, 4 Drawing Sheets

MODULE COMPONENT

This applicatino is a U.S. national phase application of PCT international application PCT/JP02/10591.

TECHNICAL FIELD

The present invention relates to a module including a circuit component, and more particularly, to a module component using a multilayer wiring substrate including the circuit component within an insulated substrate.

BACKGROUND ART

Recently, according as an electronic apparatus has been required to be downsized and high-performance, a circuit component has been needed to be high-density and high-performance more than ever. As a result, a wiring substrate is required to fit this need of high-density and high-performance of the circuit component.

A build-up method for layering a plurality of substrates is known as one method for allowing the wiring substrate to become high-density. The build-up method is described hereinafter. Photosensitive resin is coated on both surfaces of a core substrate, which is made of glass-epoxy or the like, where wiring has been formed on both sides of the core substrate by etching of copper foil. Then the core substrate is exposed and developed, so that insulating layers having a through-hole are formed. After that, electroless copper plating is applied to the surface of the core substrate, then resist coating, etching and resist removing are sequentially executed. Thus, a through-hole conductor and a wiring circuit are formed. As a result, plating is formed inside the through-hole, and wiring circuits on the different insulating layers are connected with each other.

However, in the method mentioned above for layering a plurality of substrates and performing high-density of the wiring circuit, various circuit components are mounted on a surface of the wiring substrate when they are modularized. In this case, projected areas of the circuit components determine a size of a module component, so that downsizing thereof is difficult.

Particularly, when the module component requires a high inductance, the module component needs to mount a fixed inductor, which secures electrical characteristics by winding a copper wire around a ferrite bobbin. In this case, a size or an area for mounting increases, so that downsizing of a module is difficult.

SUMMARY OF THE INVENTION

A module component, which includes an active component and a passive component within a laminated member where a plurality of insulated resin layers are laminated, includes the following elements:

wiring circuit patterns formed on at least two of the insulated resin layers, a connecting conductor, which is formed within at least one of the insulated resin layers, for electrically connecting at least two of the wiring circuit patterns each other, the active component and the passive component which are formed on at least one of the wiring circuit patterns, and electrically connected thereto, and a coil formed within the laminated member, where the coil is formed of a coil pattern made of a conductive material, and formed on at least one of the insulated resin layers, where the coil pattern is sandwiched between magnetic materials formed on the insulated resin layers.

Figure 3A:
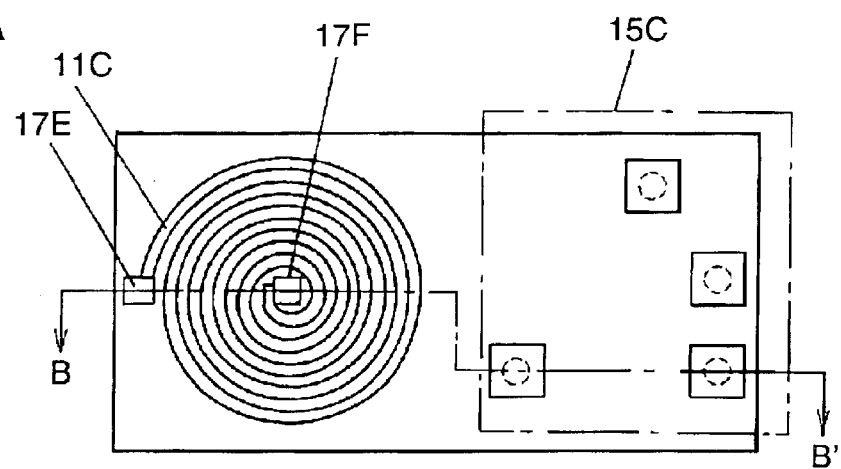
FIG. 3A is a front view of electrical insulated substrate 5 of FIG. 1.

Fist 3B is a sectional view of FIG. 3A taken along the line B–B'.

Figure 1:
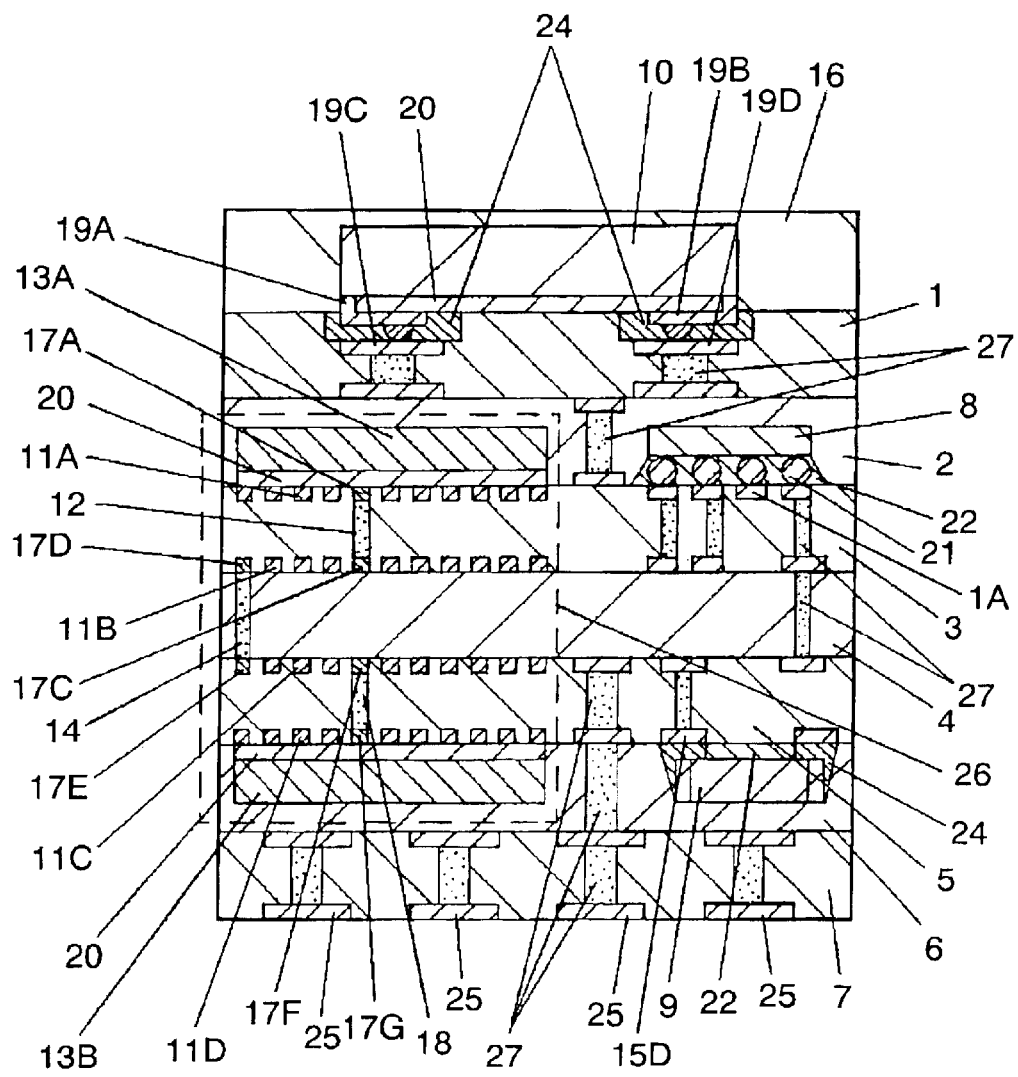
FIG. 1 is a sectional view of a module component in accordance with an exemplary embodiment of the present invention.
Figure 3B:
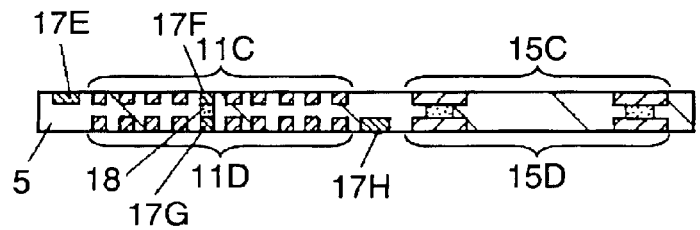
Figure 3C:
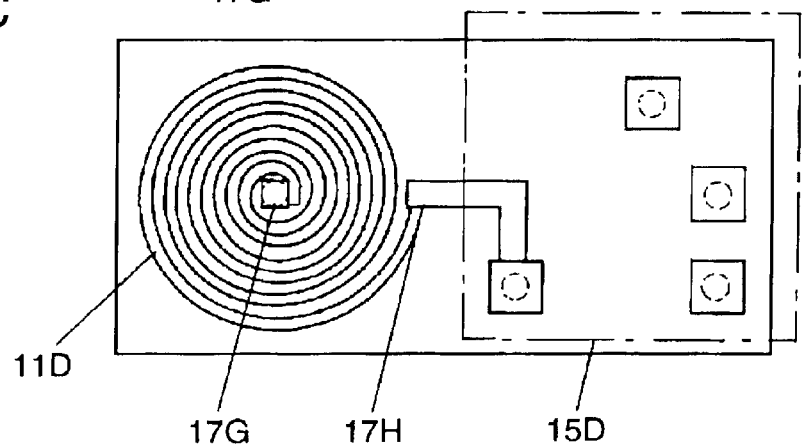

FIG. 3C is a back view of electrical insulated substrate 5 of FIG. 1.

Figure 4:
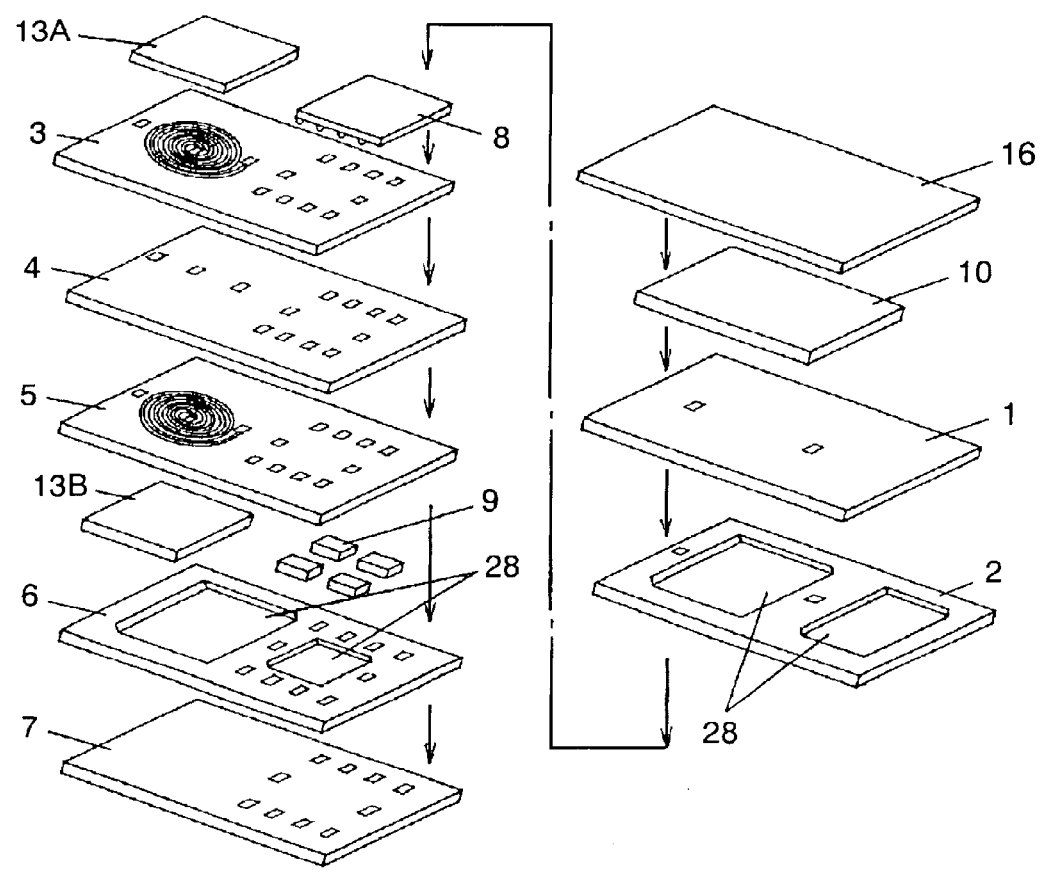

FIG. 4 is an exploded perspective view of a module component of FIG. 1.

DETAILED DESCRIPTION OF A PREFERRED EMBODIMENT

The exemplary embodiment of the present invention is demonstrated hereinafter with reference to the accompanying drawings.

FIG. 1 is a sectional view of a module component in accordance with the exemplary embodiment of the present invention.

In FIG. 1, electrical insulated substrates 1 to 7 are made of insulated resin such as epoxy resin mixed with inorganic filler, and laminated to form a laminated member. In other words, a plurality of insulated resin layers are laminated, thereby forming the laminated member.

Semiconductor bare chip 8, which is an active component such as IC or LSI, is electrically coupled with wiring circuit pattern 1A through solder bump 21, where wiring circuit pattern 1A made of a conductive material containing copper (Cu) or silver (Ag) is formed on electrical insulated substrate 3. Underfill resin 22 made of insulated resin such as epoxy resin is injected into a gap between semiconductor bare chip 8 and electrical insulated substrate 3, and hardened.

Chip component 9, which is a passive component such as a resistance, capacitor or inductor, is electrically coupled with wiring circuit pattern 15D using solder 24, where wiring circuit pattern 15D is formed on electrical insulated substrate 5. Underfill resin 22 is injected into a gap between chip component 9 and electrical insulated substrate 5, and hardened.

High-capacity capacitor 10 is mounted on electrical insulated substrate 1. For example, when this module works as DC/DC converter which converts a DC power supply into a DC power supply of a different voltage, capacitor 10 is used for stabilizing voltage fluctuation. Electrical insulated resin 16 containing epoxy resin or phenol resin covers capacitor 10. A sheet capacitor or a ceramic capacitor is used as capacitor 10.

Electrode 25 for external connection is formed on electrical insulated substrate 7, and connects the module component to an external device. Electrical insulated substrates 1 to 7 are electrically coupled with each other through via-hole conductors 27. Via-hole conductors 12, 14, 18 and 27 form conductors for electrically connecting a plurality of circuits.

Coil unit 26 is formed of spiral coil patterns 11A to 11D, which are formed on both sides of electrical insulated substrates 3 and 5, and magnetic materials 13A and 13B made of ferrite. Magnetic materials 13A and 13B are respectively bonded on one side of electrical insulated substrates 2 and 6 using adhesive 20 such as epoxy or silicone, and sandwich spiral coil patterns 11A to 11D.

Coil unit 26, which is formed mentioned above, of the module component is specifically described hereinafter with reference to FIGS. 1, 2A, 2B, 2C, 3A, 3B and 3C.

Figure 2A:
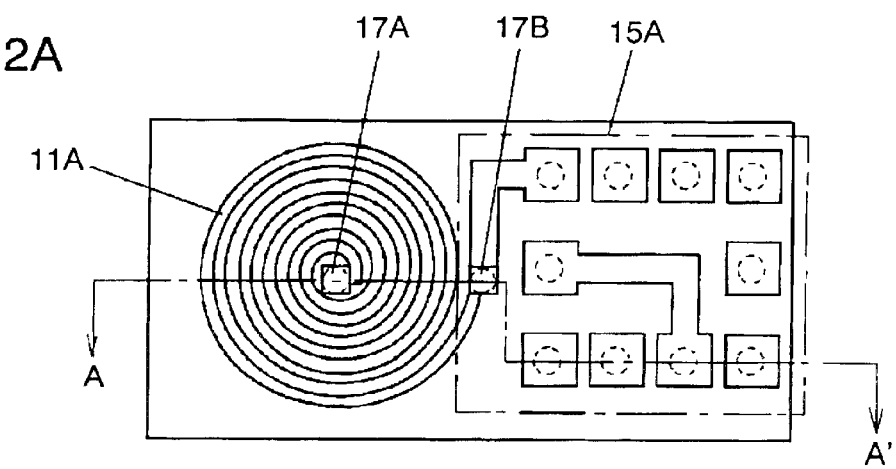
FIG. 2A is a front view of electrical insulated substrate 3 of FIG. 1.
Figure 2B:
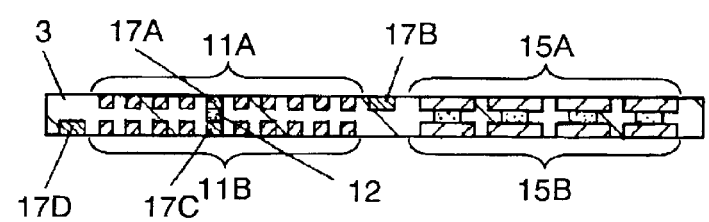
FIG. 2B is a sectional view of FIG. 2A taken along the line A–A'.
Figure 2C:
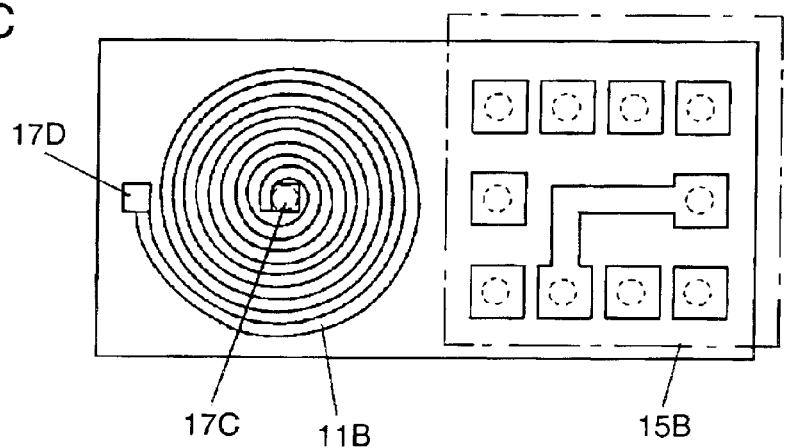
FIG. 2C is a back view of electrical insulated substrate 3 of FIG. 1.

FIG. 2A is a front view of electrical insulated substrate 3. FIG. 2B is a sectional view of electrical insulated substrate 3 taken along the line A–A'. FIG. 2C is a back view of electrical insulated substrate 3. FIG. 3A is a front view of electrical insulated substrate 5. FIG. 3B is a sectional view of electrical insulated substrate 5 taken along the line B–B'. FIG. 3C is a back view of electrical insulated substrate 5. In these Figures, spiral coil patterns 11A to 11D are made of a conductive material containing Cu or Ag, and formed on both sides of electrical insulated substrates 3 and 5. Spiral coil patterns 11A to 11D have electrodes 17A to 17G on their ends for electrical connecting.

Electrodes 17A, 17D and 17F are respectively coupled with electrodes 17C, 17E and 17G through via-hole conductors 12, 14 and 18 formed on electrical insulated substrates 3, 4 and 5. As a result, four spiral coil patterns discussed above form one coil.

In this case, certain magnetic flux is secured by coupling spiral coil patterns 11A to 11D, with their winding directions kept in the same direction. Besides, spiral coil patterns 11A to 11D are formed on a plurality of electrical insulated substrates, and ends thereof are coupled through via-hole conductors, so that the coil unit having greater magnetic flux can be formed.

Moreover, spiral coil patterns 11A to 11D are sandwiched between magnetic materials 13A and 13B made of ferrite or the like, so that magnetic permeability increases and a certain inductance value can be secured.

In the conventional method, components (e.g., coil components, active components or passive components) having large-sizes or -mounting areas are mounted on a limited area of a surface of a circuit board to form a certain circuit. Thus, downsizing is difficult because the components have to be connected on the surface of the circuit board. In addition, wiring can not be completely connected by only designing wiring on the surface, so that laminating a plurality of layers is used for connecting. However, in this case, wiring becomes longer, so that a parasitic capacitance, resistance or inductance is generated. As a result, it is difficult to secure necessary circuit characteristics.

In this invention, coil patterns are formed on parts of wiring circuit patterns, where active component or passive components are mounted, provided on a plurality of the insulated resin layers. The coil patterns are laminated, and respective insulated resin layers are electrically coupled. As a result, coil components are formed within the laminated layers, and downsizing becomes possible. Besides, wiring to active components or passive components becomes shortest by forming the coil patterns on the parts of the wiring circuit patterns. Therefore, the parasitic capacitance, resistance or inductance, which deteriorates circuit characteristics, is not generated, so that the module component of high-density and high-performance can be realized.

A manufacturing method of the module component mentioned above is described hereinafter with reference to FIGS. 1 to 4.

Epoxy resin, filler which is $SiO_2$ powder of 0.1 $\mu$m to 100 $\mu$m, and an hardening agent are mixed by a stirring-mixing machine. Resultant mixture in paste form is coated on a polyethylene terephthalate film of 75 $\mu$m thickness with a predetermined thickness by using a doctor blade method. After that, the mixture is dried but not hardened, and an insulated sheet of 80 $\mu$m thickness is formed (B stage). Then the insulated sheet is cut in predetermined sizes, and a via-hole of 0.15 mm diameter is formed using a carbon dioxide laser. Besides the carbon dioxide laser, the via-hole can be formed using various kinds of lasers (e.g., YAG laser, excimer laser) or a puncher.

Electrically conductive resin paste is applied into the via-hole using a screen printing method, so that via-hole conductors 12, 14 and 18 are formed.

Next, copper foil of 9 $\mu$m is formed on one side of carrier-transfer copper foil of 70 $\mu$m through a peel layer whose main component is chrome (Cr), thereby making copper-carrier-transfer copper foil. A surface of the copper foil opposite to the peel layer has been treated to be rough. The copper foil of 9 $\mu$m of the copper-carrier-transfer copper foil (the brand name is peelable Douhaku made by Furukawa Electric Co., LTD.) is etched by using a photolithography process and an etching process. As a result, spiral coil patterns 11A, 11B, 11C and 11D, and wiring circuit patterns 15A, 15B and 15C are formed.

Both surfaces of the insulated sheet and the patterned surface where the wiring circuit patterns are formed, of the copper-carrier-transfer copper foil are pressed and heated using an alignment-heat-press machine at 120° C. temperature and 10 kg/cm$^2$ pressure for five minutes. Because a press temperature is lower than a hardening temperature of heat-hardening resin, the heat-hardening resin in the insulated sheet softens and the wiring circuit patterns are buried in the insulated sheet. After that, the carrier-transfer copper foil is removed from the insulated sheet, so that electrical insulated substrates 1 to 7 are formed.

Circuit components are mounted on wiring circuit patterns 15A to 15C of electrical insulated substrates 1 to 7, and electrically coupled thereto.

When semiconductor bare chip 8 is coupled, for example, a bump mounting which is one of bare chip mountings is used. Electrodes on semiconductor bare chip 8 and wiring circuit pattern 15A on insulated substrates 3 are positioned for alignment using optical and electrical image processing. After that, semiconductor bare chip 8 is mounted on insulated substrates 3, and electrically coupled by pressing and heating.

Underfill resin 22 made of epoxy resin is injected into the gap between semiconductor bare chip 8 and electrical insulated substrate 3, and then hardened.

Underfill resin 22 is mixture of epoxy resin and inorganic fillers such as silica, and can release stress caused by difference of thermal expansion coefficient between semiconductor bare chip 8 and electrical insulated substrate 3, thereby improving reliability.

Not only solder bump 21 but also ACF mounting using anisotropic conductive resin can be used in the bare chip mounting. In this case, the anisotropic conductive resin is applied on wiring circuit pattern 15A, and a gold bump instead of solder bump 21 is formed on the electrode of semiconductor bare chip 8. Then, semiconductor bare chip 8 is electrically coupled by pressing and heating. In this condition, underfill resin 22 needs not to be injected into the gap between semiconductor bare chip 8 and electrical insulated substrate 3.

Electrical coupling using conductive adhesive instead of mounting using soldering can be used for mounting of the chip component.

As discussed above, after the components are mounted on electrical insulated substrates 3 and 5, electrical insulated substrates 1 to 7 are laminated as shown in FIG. 1, and heated and pressed at 175° C. and 150 kg/cm$^2$ during 120 minutes. Thus, the insulated sheets and the electrically conductive resin paste are hardened, so that the wiring circuit patterns and the insulated sheets are coupled with each other firmly and mechanically. Simultaneously, via-hole conductors 12, 14 and 18 burying the conductive resin paste are electrically connected with wiring circuit patterns 15A, 15B and 15C, so that laminated member is formed.

As shown in FIG. 4, openings 28 corresponding to projected areas of the components are formed at electrical insulated substrates 2 and 6, which are disposed at electrical insulated substrates 3 and 5 where the components are mounted. Opening 28 reduces compressive stress, which is caused in laminating, of the components and prevents deterioration of electrical characteristics.

In addition, if via-hole conductors 27, an electrode, the wiring circuit pattern or the like is formed on electrical insulated substrate 2 or 6, and opening 28 is not formed, the following disadvantage is occurred. Because electrical insulated substrates 2 and 6 softens in laminating, a position of via-hole conductors 27, the electrode or the wiring circuit pattern is displaced, so that connection between layers or circuit components becomes insufficient. Opening 28 of this invention overcomes the disadvantage mentioned above.

When magnetic materials 13A and 13B, and semiconductor bare chip 8 or chip component 9 differ in height at mounting, a plurality of insulated substrates having opening 28 corresponding to the projected areas of the components are used. The insulated substrates are laminated in a manner that thickness of the insulated substrates becomes approximately within ±5% of thickness of the mounted magnetic materials, chips or components.

The structure mentioned above prevents pressure from partly applying to the circuit components after laminating, and prevents air balls from generating around the circuit components, thereby improving reliability.

Next, high-capacity capacitor 10 is electrically coupled with the top layer of the laminated member using solder 24. After soldering, adhesive 20 is applied to a gap between capacitor 10 and electrical insulated substrate 1. This structure prevents air from being involved and air balls from generating at the gap while capacitor 10 and the electrical insulated resin are coated.

Last, electrical insulated resin 16 is applied in a manner to cover capacitor 10, thereby securing evenness. Because of the evenness, handling of a mounting apparatus such as a mounter becomes easy at mounting on a motherboard, and the capacitor becomes free from damage by a shock at handling, thereby improving reliability.

Numerals used in this embodiment are just examples, and this invention is not limited to these numerals.

As discussed above, the module including the circuit component of this invention includes the following elements:

the laminated member where a plurality of the insulated resin layers are laminated, the wiring circuit patterns formed in the laminated member, the via-hole conductor for electrically connecting at least two of the wiring circuit patterns each other, the IC chips or the chip components formed in the laminated member and electrically coupled with the wiring circuit patterns, and the coil formed at the laminated member, where the coil has the coil pattern, i.e., a pattern of a conductive material continuously formed, in the laminated member, and the coil pattern is sandwiched between ferrite layers.

In this invention, the IC chips or the chip components, which have been conventionally mounted on a surface, can be formed in the laminated member. In addition to that, a coil unit having a large-size or -mounting area can be formed in the laminated member, so that a small and high-density module component can be realized.

The module component of this invention has a plurality of the coil patterns in the laminated member, and one end of the coil pattern is electrically coupled with one end of another coil pattern formed on another layer. Using this structure, a thin coil can be formed in the laminated member, so that the module can reduce its thickness and size.

One end of the coil pattern of the coil unit is electrically coupled with one end of another coil pattern formed on another layer through the via-hole conductor, and a connecting section can be freely positioned. As a result, the module component can reduce its thickness and size.

A high-capacity capacitor is disposed on the top layer, where the wiring circuit pattern is formed, of the laminated member, so that a high-performance and high-density module component can be realized.

The coil pattern is formed of the pattern of the conductive material containing Cu and Ag, and shows low electric resistance, so that the module component having lower electric resistance can be realized.

The high-capacity capacitor is formed of the sheet capacitor or the ceramic capacitor. The sheet capacitor has a high capacity per unit volume, thereby reducing the size and thickness of the module component. The ceramic capacitor has low ESR, thereby reducing power consumption of the module component.

The insulated resin covers a part or whole of the high-capacity capacitor, thereby working as an adsorbing surface when the laminated member is mounted at the motherboard. As a result, the module component having superior mounting characteristics can be realized.

In this invention, electric elements such as active components (e.g., semiconductor elements, LSIs or ICs) or passive components (e.g., capacitance elements, resistance elements, filter elements, oscillating elements or coils) which are conventionally mounted on a surface of a multi-layer wiring substrate, can be formed within the laminated member. As a result, the small module component including high-density circuit components can be provided.

Industrial Applicability

A module component of this invention can include IC chips or chip components in its laminated member. In addition, a coil component having a large-size or -mounting area can be formed in the laminated member, so that the small and high-density module component can be realized.

What is claimed is:

1. A module component, which includes an active component and a passive component within a laminated member where a plurality of insulated resin layers are laminated, comprising:

wiring circuit patterns formed on at least two of the insulated resin layers;

a connecting conductor, which is formed within at least one of the insulated resin layers, for electrically connecting at least two of the circuit patterns each other;

the active component and the passive component which are formed on at least one of the wiring circuit patterns, and electrically connected thereto; and a coil formed within the laminated member, wherein the coil is formed of a coil pattern made of a conductive material, and formed on at least one of the insulated resin layers, wherein the coil pattern is sandwiched between magnetic materials formed on the insulated resin layers.

2. The module component of claim 1, wherein one end of the coil pattern is electrically coupled with one end of another coil pattern formed on another of the insulated resin layer.

3. The module component of claim 2, wherein one end of the coil pattern is electrically coupled with one end of another coil pattern formed on another of the insulated resin layer through a via-hole conductor.

4. The module component of claim 1, wherein a capacitor is disposed on a top layer, where a wiring circuit pattern is formed, of the laminated member.

5. The module component of claim 4, wherein the capacitor is formed of one of a sheet capacitor and a ceramic capacitor.

6. The module component of claim 4, wherein at least one part of the capacitor is covered with insulated resin.

7. The module component of claim 1, wherein the coil pattern is formed of a pattern of the conductive material containing Cu and Ag.

* * * * *

UNITED STATES PATENT AND TRADEMARK OFFICE
CERTIFICATE OF CORRECTION

PATENT NO. : 6,828,670 B2
DATED : December 7, 2004
INVENTOR(S) : Hayama et al.

It is certified that error appears in the above-identified patent and that said Letters Patent is hereby corrected as shown below:

<u>Title page,</u>
Item [75], Inventors, "Masaaki Hayama, Nara (JP); Hiroshi Higashitani, Osaka (JP)" should read -- Masaaki Hayama, Nara (JP); Hiroshi Higashitani, Osaka (JP); Takeo Yasuho, Osaka (JP); Masaaki Katsumata, Osaka (JP); Hiroyuki Handa, Osaka (JP) --.

Signed and Sealed this

Nineteenth Day of July, 2005

JON W. DUDAS
*Director of the United States Patent and Trademark Office*